United States Patent
Taira

(10) Patent No.: US 9,117,854 B2
(45) Date of Patent: Aug. 25, 2015

(54) SUBSTRATE PROCESSING APPARATUS, SUBSTRATE PROCESSING METHOD, AND STORAGE MEDIUM STORING A COMPUTER PROGRAM FOR PERFORMING SUBSTRATE PROCESSING METHOD

(75) Inventor: Masaki Taira, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 1210 days.

(21) Appl. No.: 13/039,536

(22) Filed: Mar. 3, 2011

(65) Prior Publication Data

US 2011/0220157 A1  Sep. 15, 2011

(30) Foreign Application Priority Data

Mar. 10, 2010  (JP) ................................ 2010-053048

(51) Int. Cl.
*B08B 3/00*    (2006.01)
*H01L 21/67*   (2006.01)
*H01L 21/02*   (2006.01)

(52) U.S. Cl.
CPC .... *H01L 21/67017* (2013.01); *H01L 21/02041* (2013.01)

(58) Field of Classification Search
CPC ................. H01L 21/67051; H01L 21/02052; H01L 21/67057; Y10S 134/902; B08B 7/0021
USPC ...... 134/26, 105, 36, 34, 30, 902, 56 R, 94.1, 134/95.2, 10, 109; 257/E21.228, E21.255, 257/E21.309
See application file for complete search history.

(56) References Cited

U.S. PATENT DOCUMENTS

| | | | |
|---|---|---|---|
| 5,383,970 A * | 1/1995 | Asaba et al. | 118/726 |
| 5,766,321 A | 6/1998 | Ishihara et al. | |
| 6,082,381 A | 7/2000 | Kamikawa et al. | |
| 2004/0194806 A1 * | 10/2004 | Yang et al. | 134/18 |

FOREIGN PATENT DOCUMENTS

| | | | | |
|---|---|---|---|---|
| JP | 06-190360 A1 | 7/1994 | | |
| JP | 11-097403 A1 | 4/1999 | | |
| JP | 2001-246362 A1 | 9/2001 | | |
| JP | 2001-347102 A1 | 12/2001 | | |
| JP | 2002-301305 A1 | 10/2002 | | |
| JP | 2004207515 A * | 7/2004 | ............ | H01L 21/027 |
| JP | 2006-269668 A1 | 10/2006 | | |

OTHER PUBLICATIONS

Yamazaki et al., "Device and method for removing photoresist", Jul. 2004, JP 2004-207515 Machine Translation.*

* cited by examiner

*Primary Examiner* — Michael Barr
*Assistant Examiner* — Thomas Bucci
(74) *Attorney, Agent, or Firm* — Burr & Brown, PLLC

(57) ABSTRACT

A substrate processing apparatus according to the present invention comprises: a processing part configured to process a substrate; a chemical-liquid storing container configured to store a chemical liquid; a chemical-liquid supply driving part configured to supply the chemical liquid from the chemical-liquid storing container into the processing part; a circulation line configured to circulate the chemical liquid stored in the chemical-liquid storing container; and a mixture generating part provided on the circulation line. An inert-gas supply source is configured to supply an inert gas into the mixture generating part. The mixture generating part is configured to mix the chemical liquid supplied from the chemical-liquid storing container and the inert gas supplied from the inert-gas supply source with each other so as to generate a gas-liquid mixture.

9 Claims, 3 Drawing Sheets

SUBSTRATE PROCESSING APPARATUS, SUBSTRATE PROCESSING METHOD, AND STORAGE MEDIUM STORING A COMPUTER PROGRAM FOR PERFORMING SUBSTRATE PROCESSING METHOD

CROSS REFERENCE TO RELATED APPLICATIONS

This application is based upon and claims the benefit of priority from the prior Japanese Patent Application No. 2010-53048 filed on Mar. 10, 2010, the entire contents of which are incorporated herein by reference.

BACKGROUND OF THE INVENTION

1. Field of the Invention

The present invention relates to a substrate processing apparatus, a substrate processing method, and a storage medium storing a computer program for performing the substrate processing method. In particular, the present invention relates to a substrate processing apparatus, a substrate processing method, and a storage medium storing a computer program for performing the substrate processing method, which are capable of reducing oxygen dissolved in a chemical liquid so as to improve processing efficiency of a substrate and to improve reliability.

2. Description of Related Art

There has been conventionally known a substrate processing apparatus configured to clean a substrate such as a semiconductor wafer or a glass substrate for LCD (herein referred to simply as "wafer"), by immersing the wafer in a cleaning liquid such as a deionized water or a chemical liquid (e.g., hydrogen fluoride, HF) stored in a cleaning tank (see, JP11-97403A, for example). In such a substrate processing apparatus, the chemical liquid is stored in a chemical-liquid storing container. When a wafer is cleaned with a chemical liquid, the chemical liquid is supplied from the chemical-liquid storing container into the cleaning tank, so that an oxide film on a surface of the wafer is etched. In addition, a deionized water is stored in a deionized-water storing container. When a wafer is cleaned with a chemical liquid, the deionized water is supplied from the deionized-water storing container into the cleaning tank. Further, when a wafer is cleaned with a deionized water, the deionized water is supplied into the cleaning tank, so that the wafer is cleaned (rinsed) with the deionized water.

When oxygen is dissolved in the deionized water to be supplied into the cleaning tank, there occurs a problem in that an oxide film is formed on the surface of the wafer by the oxygen. Thus, the deionized water is generally deaerated beforehand so as to reduce oxygen dissolved in the deionized water.

SUMMARY OF THE INVENTION

On the other hand, when oxygen is dissolved in the chemical liquid, there is a possibility that an oxide film might be formed on the surface of the wafer by the oxygen. In this case, it is difficult to efficiently remove the oxide film from the wafer surface when the wafer is cleaned with the chemical liquid, resulting in deterioration in cleaning efficiency of the wafer.

JP2006-269668A discloses a substrate processing apparatus that removes polymer (resist residue) remaining on a substrate, by using a polymer removal liquid as a cleaning liquid. In JP2006-269668A, oxygen molecules are removed from a chemical liquid by causing the chemical liquid to pass through a hollow fiber separation membrane with the use of a vacuum pump, so as to restrain or prevent an oxidation reaction on the substrate.

However, the chemical liquid such as HF in use for etching an oxide film formed on a wafer W is strongly acidic. Thus, when the method disclosed in JP2006-269668A is used for removing oxygen dissolved in the chemical liquid such as HF, there is a problem in that the vacuum pump corrodes away.

The present invention has been made in view of the above circumstances. The object of the present invention is to provide a substrate processing apparatus, a substrate processing method, and a storage medium storing a computer program for performing the substrate processing method, which are capable of reducing oxygen dissolved in a chemical liquid so as to improve processing efficiency of a substrate and to improve reliability.

The present invention provides a substrate processing apparatus comprising: a processing part configured to process a substrate with the use of a chemical liquid; a chemical-liquid storing container configured to store the chemical liquid; a chemical-liquid supply driving part configured to supply the chemical liquid, from the chemical-liquid storing container into the processing part; a circulation line configured to circulate the chemical liquid stored in the chemical-liquid storing container; a mixture generating part provided on the circulation line; and an inert-gas supply source configured to supply an inert gas into the mixture generating part; wherein the mixture generating part is configured to mix the chemical liquid supplied from the chemical-liquid storing container and the inert gas supplied from the inert-gas supply source with each other so as to generate a gas-liquid mixture, and to supply the gas-liquid mixture into the chemical-liquid storing container.

In the aforementioned substrate processing apparatus, it is preferable that the mixture generating part is formed of an ejector configured to suck the chemical liquid from the chemical-liquid storing container, due to a flow of the supplied inert gas, and to mix the chemical liquid and the inert gas with each other so as to generate the gas-liquid mixture.

In addition, in the aforementioned substrate processing apparatus, it is preferable that the inert-gas supply source is configured to supply an inert gas into the chemical-liquid storing container; a gas supply destination switching part configured to switch a destination of the inert gas supplied from the inert-gas supply source, between the mixture generating part and the chemical-liquid storing container, is disposed between the inert-gas supply source and the mixture generating part; when the chemical liquid is circulated in the circulation line, the inert gas is supplied into the mixture generating part; and when the chemical liquid is supplied into the processing part, the inert gas is supplied into the chemical-liquid storing container.

In addition, in the aforementioned substrate processing apparatus, it is preferable that a first gas supply line configured to supply the inert gas into the mixture generating part is disposed between the inert-gas supply source and the mixture generating part; the first gas supply line is provided with a first gas supply opening and closing valve; a second gas supply line configured to supply the inert gas into the chemical-liquid storing container is disposed between the inert-gas supply source and the chemical-liquid storing container; the second gas supply line is provided with a second gas supply opening and closing valve; and the gas supply destination switching part is formed of the first gas supply opening and closing valve and the second gas supply opening and closing valve.

In addition, in the aforementioned substrate processing apparatus, it is preferable that the chemical-liquid storing container is provided with an inlet part configured to introduce the gas-liquid mixture supplied from the mixture generating part into the stored chemical liquid.

In addition, in the aforementioned substrate processing apparatus, it is preferable that a chemical-liquid supply line configured to supply the chemical liquid into the processing part is disposed between the processing part and the chemical-liquid storing container; the chemical-liquid supply line is provided with a chemical-liquid supply opening and closing valve; the circulation line is provided with a first circulation opening and closing valve on a part where the chemical liquid is supplied from the chemical-liquid storing container into the mixture generating part; when the chemical-liquid supply opening and closing valve is closed, the first circulation opening and closing valve is opened to supply the chemical liquid into the mixture generating part; and when the chemical-liquid supply opening and closing valve is opened, the first circulation opening and closing valve is closed to supply the chemical liquid into the processing part.

In addition, in the aforementioned substrate processing apparatus, it is preferable that a gas discharge line configured to discharge a gas from an inside of the chemical-liquid storing container is connected to an upper part of the chemical-liquid storing container.

In addition, in the aforementioned substrate processing apparatus, it is preferable that the gas discharge line is provided with a gas discharge opening and closing valve, and the gas discharge opening and closing valve is opened when the chemical-liquid supply opening and closing valve is closed.

In addition, in the aforementioned substrate processing apparatus, it is preferable that the circulation line is provided with a second circulation opening and closing valve on a part where the gas-liquid mixture is supplied from the mixture generating part into the chemical-liquid storing container, and the second circulation opening and closing valve is opened when the chemical-liquid supply opening and closing valve is closed, while the second circulation opening and closing valve is closed when the chemical-liquid supply opening and closing valve is opened.

The present invention provides a substrate processing method that processes a substrate by using a substrate processing apparatus including a processing part configured to process a substrate with the use of a chemical liquid, a chemical-liquid storing container configured to store the chemical liquid, and an inert-gas supply source, the substrate processing method comprising: mixing a chemical liquid and an inert gas in a mixture generating part by supplying a chemical liquid from the chemical-liquid storing container into the mixture generating part, and by supplying an inert gas from the inert-gas supply source into the mixture generating part, so as to generate a gas-liquid mixture, and supplying the generated gas-liquid mixture into the chemical-liquid storing container so as to circulate the chemical liquid; and supplying the chemical liquid from the chemical-liquid storing container into the processing part so as to process a substrate in the processing part.

In the aforementioned substrate processing method, it is preferable that the mixture generating part is formed of an ejector, and while the chemical liquid is circulated, the ejector sucks the chemical liquid from the chemical-liquid storing container, due to a flow of the supplied inert gas, and mixes the chemical liquid and the inert gas with each other so as to generate the gas-liquid mixture.

In addition, in the aforementioned substrate processing method, it is preferable that while the substrate is processed, an inert gas is supplied into the chemical-liquid storing container.

In the aforementioned substrate processing method, it is preferable that while the chemical liquid is circulated, a gas is discharged from an inside of the chemical-liquid storing container through a gas discharge line connected to an upper part of the chemical-liquid storing container.

The present invention provides a storage medium storing a computer program for performing a substrate processing method that processes a substrate by using a substrate processing apparatus including a processing part configured to process a substrate with the use of a chemical liquid, a chemical-liquid storing container configured to store the chemical liquid, and an inert-gas supply source, the substrate processing method comprising: mixing a chemical liquid and an inert gas in a mixture generating part by supplying a chemical liquid from the chemical-liquid storing container into the mixture generating part, and by supplying an inert gas from the inert-gas supply source into the mixture generating part, so as to generate a gas-liquid mixture, and supplying the generated gas-liquid mixture into the chemical-liquid storing container so as to circulate the chemical liquid; and supplying the chemical liquid from the chemical-liquid storing container into the processing part so as to process a substrate in the processing part.

According to the present invention, oxygen dissolved in a chemical liquid can be reduced so as to improve processing efficiency of a substrate and to improve reliability.

DETAILED DESCRIPTION OF THE INVENTION

Herebelow, embodiments of the present invention will be described with reference to the drawings.

First Embodiment

Figure 1:
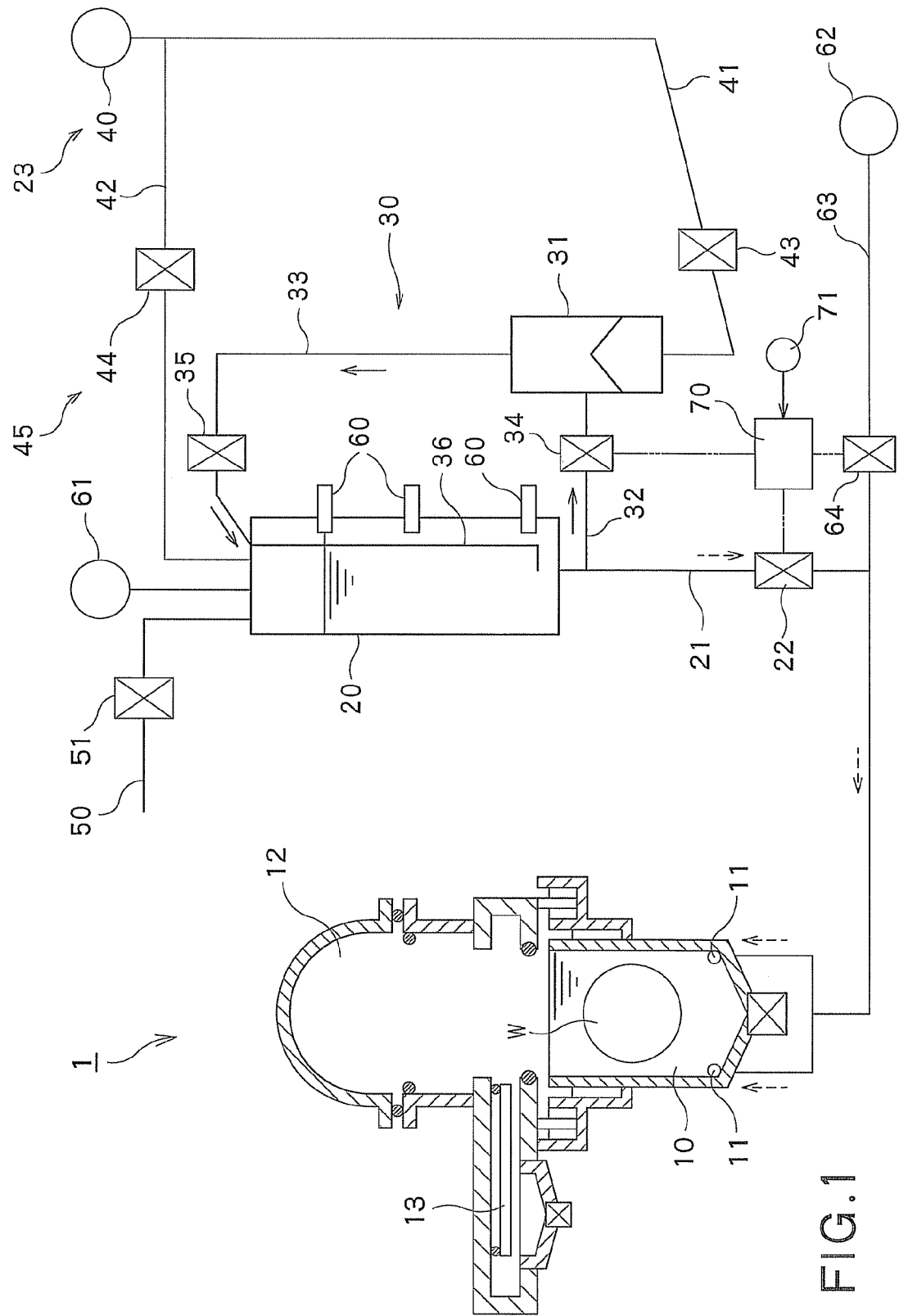
FIG. 1 is a substrate processing apparatus in a first embodiment of the present invention.
Figure 2:
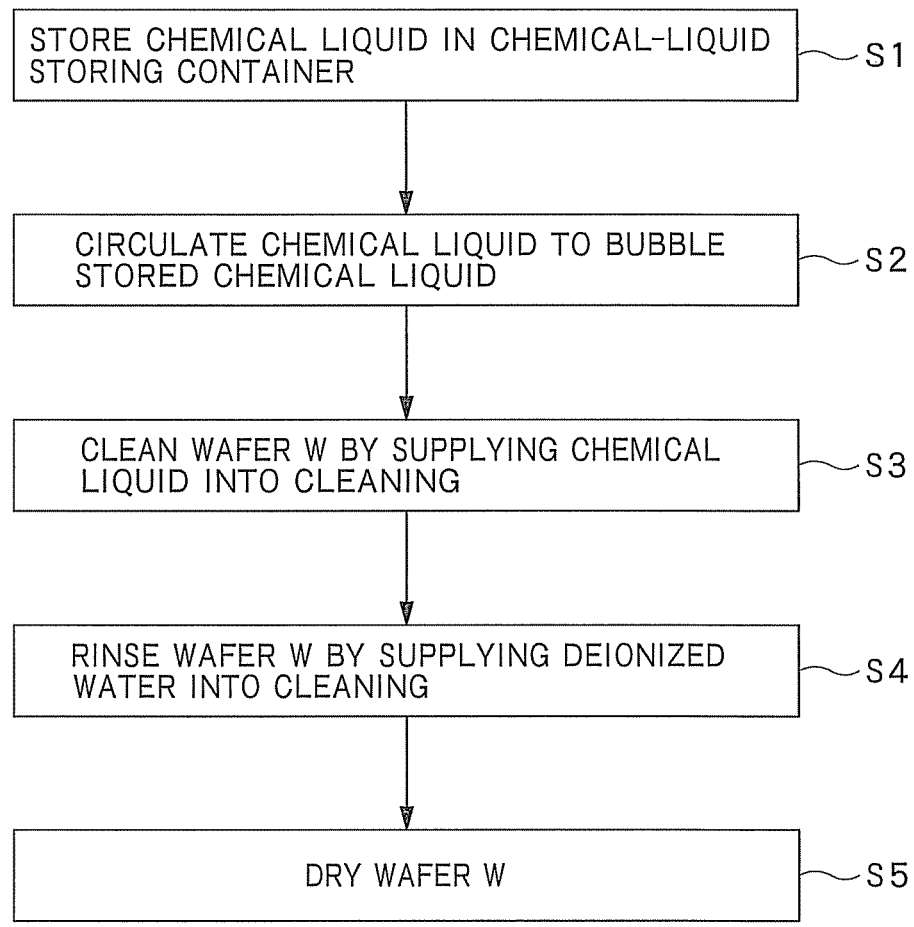
FIG. 2 is a substrate processing method in a first embodiment of the present invention.

A first embodiment of the present invention is described with reference to FIGS. 1 and 2. FIGS. 1 and 2 are views for explaining the first embodiment of a substrate processing apparatus, a substrate processing method, and a storage medium storing a computer program for performing the substrate processing method.

As shown in FIG. 1, a substrate processing apparatus 1 includes: a cleaning tank (processing part) 10 configured to clean a plurality of substrates (e.g., semiconductor wafers, hereinafter referred to simply as "wafers W") by using a chemical liquid (e.g., hydrogen fluoride, HF) or a deionized water; a chemical-liquid storing container 20 configured to store the chemical liquid; a chemical-liquid supply driving part 23 configured to supply the chemical liquid from the chemical-liquid storing container 20 into the cleaning tank 10; and an inert-gas supply source 40 configured to supply an inert gas ($N_2$ gas) into the chemical-liquid storing container 20. In this embodiment, the chemical-liquid supply driving part 23 is formed of the inert-gas supply source 40. When the inert-gas supply source 40 pressurizes an inert gas and supplies the pressurized inert gas into the chemical-liquid storing container 20, an inside of the chemical-liquid storing container 20 is pressurized so that the chemical liquid therein is supplied into the cleaning tank 10. In addition, the inert-gas supply source 40 is configured to supply an inert gas to a mixture generating part 31 which will be described below. A deionized-water supply source 62 for supplying a deionized water is connected to the cleaning tank 10. Similarly to the above, the deionized-water supply source 62 is configured to pressurize a deionized water and to supply the pressurized deionized water into the cleaning tank 10.

Disposed on a lower part of the cleaning tank 10 is a nozzle 11 for jetting a chemical liquid supplied from the chemical-liquid storing container 20, or a deionized water supplied from the deionized-water supply source 62, toward wafers W. Thus, a chemical liquid or a deionized water is jetted toward wafers W in the cleaning tank 10, so that the wafers W are cleaned.

In addition, a drying chamber 12 for drying cleaned wafers W is disposed above the cleaning tank 10. A shutter 13 is provided between the cleaning tank 10 and the drying chamber 12, whereby the cleaning tank 10 and the drying chamber 12 can be shielded from each other.

A chemical-liquid supply line 21 for supplying a chemical liquid into the cleaning tank 10 connects the cleaning tank 10 and the chemical-liquid storing container 20 with each other. The chemical-liquid supply line 21 is provided with a chemical-liquid supply opening and closing valve 22 that opens and closes the chemical-liquid supply line 21. Thus, when the chemical-liquid supply opening and closing valve 22 is opened, a chemical liquid is supplied from the chemical-liquid storing container 20 into the cleaning tank 10. In this embodiment, an end of the chemical-liquid supply line 21 on the side of the cleaning tank 10 is connected to the below-described deionized-water supply line 63 so as to be merged with the deionized-water supply line 63.

The chemical-liquid storing container 20 is equipped with a circulation line 30 through which a stored chemical liquid circulates. The circulation line 30 has a first circulation line 32 and a second circulation line 33. The first circulation line 32 extends between the chemical-liquid storing container 20 and an ejector 31, which will be described below, for supplying a chemical liquid from the chemical-liquid storing container 20 into the ejector 31. The second circulation line 33 extends between the ejector 31 and the chemical-liquid storing container 20, for supplying a gas-liquid mixture (described below) generated by the ejector 31 to the chemical-liquid storing container 20.

The circulation line 30 is provided with the ejector (mixture generating part) 31 that mixes a chemical liquid supplied from the chemical-liquid storing container 20 and an inert gas supplied from the inert-gas supply source 40 with each other so as to generate a gas-liquid mixture. Namely, due to a flow of the supplied inert gas that reduces a pressure inside the first circulation line 32 to a negative pressure, the ejector 31 sucks a chemical liquid from the first circulation line 32, and mixes the misty chemical liquid and the inert gas with each other so as to generate a gas-liquid mixture. Then, the ejector 31 supplies the gas-liquid mixture into the chemical-liquid storing container 20 through the second circulation line 33. In this embodiment, an end of the first circulation line 32 on the side of the chemical-liquid storing container 20 is connected to the chemical-liquid supply line 21, so that the first circulation line 32 is diverged from the chemical-liquid supply line 21.

Disposed on the chemical-liquid storing container 20 is an inlet pipe (inlet part) 36 that introduces the gas-liquid mixture supplied from the second circulation line 33 into the chemical liquid stored in the chemical-liquid storing container 20. One end of the inlet pipe 36 is connected to the second circulation line 33, and the other end thereof extends to a lower part of the chemical-liquid storing container 20, so that the gas-liquid mixture can be introduced from the lower part of the stored chemical liquid into the chemical liquid. Thus, the inert gas of the gas-liquid mixture becomes bubbles and elevates in the chemical liquid (bubbles the chemical liquid) to reach a gaseous phase space formed in an upper part of the chemical-liquid storing container 20. Meanwhile, the chemical liquid of the gas-liquid mixture is stored in the chemical-liquid storing container 20. In this manner, the chemical liquid is circulated. Since the inlet pipe 36 extends to the lower part of the chemical-liquid storing container 20, a liquid level of the chemical liquid is prevented from waving, whereby detection precision of the liquid level of the chemical liquid by means of the below-described level sensors 60 can be improved.

The first circulation line 32 (a part to which the chemical liquid is supplied from the chemical-liquid storing container 20 to the ejector 31) is provided with a first circulation opening and closing valve 34 that opens and closes the first circulation line 32. In addition, the second circulation line 33 (a part to which the gas-liquid mixture is supplied from the ejector 31 to the chemical-liquid storing container 20) is provided with a second circulation opening and closing valve 35 that opens and closes the second circulation line 33. When the chemical-liquid supply opening and closing valve 22 closed, the first circulation opening and closing valve 34 and the second circulation opening and closing valve 35 are opened to supply the chemical liquid from the chemical-liquid storing container 20 to the ejector 31, so that the chemical liquid is circulated. On the other hand, when the chemical-liquid supply opening and closing valve 22 is opened, the first circulation opening and closing valve 34 and the second circulation opening and closing valve 35 are closed to stop the supply of the gas-liquid mixture from the ejector 31 to the chemical-liquid storing container 20, so that the chemical liquid is supplied from the chemical-liquid storing container 20 into the cleaning tank 10.

A first gas supply line 41 for supplying an inert gas to the ejector 31 extends between the inert-gas supply source 40 and the ejector 31. In addition, provided between the inert-gas supply source 40 and the chemical-liquid storing container 20 is a second gas supply line 42 that does not supply an inert gas into the ejector 31 but supplies an inert gas into the chemical-liquid storing container 20. An end of the second gas supply line 42 on the side of the inert-gas supply source 40 is connected to the first gas supply line 41, so that the second gas supply line 42 is diverged from the first gas supply line 41.

The first gas supply line 41 is provided with a first gas supply opening and closing valve 43 that opens and closes the first gas supply line 41. When the chemical-liquid supply opening and closing valve 22 is closed, the first gas supply opening and closing valve 43 is opened to supply an inert gas into the ejector 31. On the other hand, when the chemical-liquid supply opening and closing valve 22 is opened, the first gas supply opening and closing valve 43 is closed to stop the supply of the inert gas from the inert-gas supply source 40 into the ejector 31.

The second gas supply line 42 is provided with a second gas supply opening and closing valve 44 that opens and closes the second gas supply line 42. When the chemical-liquid supply opening and closing valve 22 is opened, the second gas supply opening and closing valve 44 is opened to directly supply an inert gas into the chemical-liquid storing container 20. In this case, the inside of the chemical-liquid storing container 20 is pressurized so that the chemical liquid is supplied into the cleaning tank 10. When the chemical-liquid supply opening and closing valve 22 is closed, the second gas supply opening and closing valve 44 is closed to stop the supply of the inert gas from the inert-gas supply source 40 to the chemical-liquid storing container 20 through the second gas supply line 42.

The above-described first gas supply opening and closing valve 43 and the second gas supply opening and closing valve 44 constitute a gas supply destination switching part 45 that switches a supply destination of an inert gas from the inert-gas supply source 40, whereby a destination of the supplied inert gas can be switched between the chemical-liquid storing container 20 and the ejector 31.

Connected to an upper part of the chemical-liquid storing container 20 is a gas discharge line 50 for discharging a gas from the inside thereof. The gas discharge line 50 is provided with a gas discharge opening and closing valve 51 that opens and closes the gas discharge line 50. When the chemical-liquid supply opening and closing valve 22 is closed, the gas discharge opening and closing valve 51 is opened to discharge a gas containing oxygen, which has been removed from the chemical liquid, together with the inert gas, from the upper part of the chemical-liquid storing container 20. When the chemical-liquid supply opening and closing valve 22 is opened, the gas discharge opening and closing valve 51 is closed.

The chemical-liquid storing container 20 is equipped with the plurality of level sensors 60 for detecting a liquid level of the chemical liquid stored therein. A control unit 70, which will described below, is connected to the respective level sensors 60. In addition, a chemical-liquid supply source 61 for supplying a chemical liquid into the chemical-liquid storing container 20 is connected to the chemical-liquid storing container 20. Based on detection signals from the level sensors 60, the control unit 70 is configured to control the chemical-liquid supply source 61, such that a chemical liquid is supplied (replenished) from the chemical-liquid supply source 61 to the chemical-liquid storing container 20.

A deionized-water supply line 63 extends between the cleaning tank 10 and the deionized-water supply source 62. The deionized-water supply line 63 is provided with a deionized-water supply opening and closing valve 64 that opens and closes the deionized-water supply line 63. When the deionized-water supply opening and closing valve 64 is opened, a deionized water is supplied from the deionized-water supply source 62 into the cleaning tank 10.

The aforementioned respective opening and closing valves 22, 34, 35, 43, 44, 51 and 64 are connected to the control unit 70. When the control unit 70 circulates the chemical liquid, the control unit 70 controls the respective opening and closing valves 22, 34, 35, 43, 44, 51 and 64, such that the chemical-liquid supply opening and closing valve 22 and the second gas supply opening and closing valve 44 are closed, and that the first circulation opening and closing valve 34, the second circulation opening and closing valve 35, the first gas supply opening and closing valve 43 and the gas discharge opening and closing valve 51 are opened.

When a cleaning process by means of a chemical liquid is performed in the cleaning tank 10, the control unit 70 controls the respective opening and closing valves 22, 34, 35, 43, 44, 51 and 64, such that the chemical-liquid supply opening and closing valve 22 and the second gas supply opening and closing valve 44 are opened, and that the first circulation opening and closing valve 34, the second circulation opening and closing valve 35, the first gas supply opening and closing valve 43 and the gas discharge opening and closing valve 51 are closed. In addition, at this time, the control unit 70 opens the deionized-water supply opening and closing valve 64. In this manner, a chemical liquid and a deionized water can be supplied into the cleaning tank 10. On the other hand, when a cleaning process (rinse process) by means of a deionized water is performed in the cleaning tank 10, the control unit 70 controls the chemical-liquid opening and closing valve 22 and the deionized-water supply opening and closing valve 64, such that the opening and closing valve 22 is closed and that the opening and closing valve 64 is opened. In this manner, a deionized water can be supplied into the cleaning tank 10.

In this embodiment, the control unit 70 includes a computer. The computer executes a program previously stored in a storage medium 71, so that the cleaning process of wafer W with the use of the substrate processing apparatus 1 is performed.

Next, an operation of this embodiment as structured above, i.e., a substrate processing method in this embodiment will be described.

As shown in FIG. 2, a chemical liquid is supplied from the chemical-liquid supply source 61 into the chemical-liquid storing container 20, so that the chemical liquid is stored in the chemical-liquid storing container 20 (step S1).

Then, as shown by the solid arrows in FIG. 1, the chemical liquid is circulated so as to bubble the stored chemical liquid (step S2).

In this case, the control unit 70 closes the chemical-liquid supply opening and closing valve 22 and the second gas supply opening and closing valve 44, and opens the first circulation opening and closing valve 34, the second circulation opening and closing valve 35, the first gas supply opening and closing valve 43, and the gas discharge opening and closing valve 51. Thus, the chemical liquid is supplied into the ejector 31 from the chemical-liquid storing container 20 through the first circulation line 32. At the same time, an inert gas is supplied to the ejector 31 from the inert-gas supply source 40 through the first gas supply line 41. Thus, the chemical liquid and the inert gas are mixed with each other in the ejector 31 so that a gas-liquid mixture is generated therein. That is to say, due to the flow of the supplied inert gas that reduces the pressure inside the first circulation line 32 to a negative pressure, the ejector 31 sucks a chemical liquid from the first circulation line 32 so as to generate a gas-liquid mixture. The thus generated gas-liquid mixture passes through second circulation line 33 so as to be supplied into the inlet pipe 36 provided on the chemical-liquid storing container 20. Then, the gas-liquid mixture is introduced from the inlet pipe 36 to the lower part of the stored chemical liquid. Thus, the inert gas of the gas-liquid mixture having been introduced from the inlet pipe 36 becomes bubbles and elevates in the chemical liquid (bubbles the chemical liquid) to reach the gaseous phase space. Meanwhile, the chemical liquid of the gas-liquid mixture is stored in the chemical-liquid storing container 20. In this manner, the chemical liquid is circulated.

The inert gas having become bubbles reaches the gaseous phase space, together with oxygen dissolved in the chemical liquid. The inert gas having reached the gaseous phase space, together with the oxygen, passes through the gas discharge line 50 so as to be discharged from the chemical-liquid storing container 20.

Then, as shown by the dotted arrows in FIG. 1, the chemical liquid having less dissolved oxygen is supplied to the cleaning tank 10, and wafers W are cleaned (step S3).

In this case, the control unit 70 opens the chemical-liquid supply opening and closing valve 22 and the second gas supply opening and closing valve 44, and closes the first circulation opening and closing valve 34, the second circulation opening and closing valve 35, the first gas supply opening and closing valve 43 and the gas discharge opening and closing valve 51. In this case, a pressurized inert gas is supplied from the inert-gas supply source 40 to the chemical-liquid storing container 20 through the second gas supply line 42. Thus, the inside of the chemical-liquid storing container 20 is pressurized, so that the chemical liquid having less dissolved oxygen is supplied from the chemical-liquid storing container 20 into the cleaning tank 10 through the chemical-liquid supply line 21. In addition, at this time, the deionized-water supply opening and closing valve 64 is opened by the control unit 70. Thus, a pressurized deionized water is supplied from the deionized-water supply source 62. The pressurized deionized water is merged and mixed with the chemical liquid in the course of the deionized-water supply line 63, and is supplied into the cleaning tank 10.

The chemical liquid having been supplied into the cleaning tank 10 is jetted toward the wafers W from the nozzle 11. Thus, oxide films on the surfaces of the respective wafers W are etched, whereby the wafers W are cleaned with the chemical liquid.

Then, a deionized water is supplied into the cleaning tank 10, and the wafers W are cleaned (rinsed) (step S4). In this case, the control unit 70 closes the chemical-liquid supply opening and closing valve 22, and opens the deionized-water supply opening and closing valve 64. Thus, a deionized water is supplied from the deionized-water supply source 62 into the cleaning tank 10. The deionized water is jetted toward the wafers W, whereby the wafers W are cleaned with the deionized water.

Thereafter, the wafers W are transferred to the drying chamber 12, and the shutter 13 is closed. Then, the wafers W are dried in the drying chamber 12 (step S5).

In the above-described step S3, since the chemical liquid is supplied from the chemical-liquid storing container 20 into the cleaning tank 10, the amount of the chemical liquid stored in the chemical-liquid storing container 20 is reduced, so that the liquid level of the chemical liquid lowers. Thus, when the control unit 70 judges that the liquid level of the chemical liquid lowers up to a predetermined position based on detection signals from the level sensors 60 for detecting the liquid level of the chemical liquid, a chemical liquid is replenished to the chemical-liquid storing container 20 from the chemical-liquid supply source 61. In this case, as in the above-described step S2, the chemical liquid is circulated so as to bubble the stored chemical liquid, whereby oxygen dissolved in the chemical liquid is reduced.

According to this embodiment, a chemical liquid supplied from the chemical-liquid storing container 20 through the first circulation line 32, and an inert gas supplied from the inert-gas supply source 40 through the inert-gas supply line 41, are mixed with each other by the ejector 31, so that a gas-liquid mixture is generated therein. Thus, the generated gas-liquid mixture passes through the second circulation line 33 so as to be supplied into the inlet pipe 36 provided on the chemical-liquid storing container 20. Then, the gas-liquid mixture is introduced from the inlet pipe 36 to the stored chemical liquid. The inert gas of the introduced gas-liquid mixture becomes bubbles in the stored chemical liquid. The inert gas together with oxygen dissolved therein elevates in the chemical liquid to reach the gaseous phase space in the upper part of the chemical-liquid storing container 20. Thus, the oxygen dissolved in the stored chemical liquid can be reduced. Thereafter, the wafers W are cleaned with the chemical liquid having less dissolved oxygen, whereby an oxide film can be efficiently etched from the surface of each wafer W. As a result, a cleaning efficiency of the wafer W can be improved.

In addition, according to this embodiment, a chemical liquid can be circulated by returning the chemical liquid to the chemical-liquid storing container 20 sequentially through the first circulation line 32, the ejector 31, the second circulation line 33, and the inlet pipe 36. Thus, the stored chemical liquid can be stirred, whereby oxygen dissolved in the stored chemical liquid can be efficiently reduced. Such a circulation of the chemical liquid is performed by the ejector 31 that sucks the chemical liquid from the chemical-liquid storing container 20 due to a flow of an inert gas. Thus, as compared with a case in which the circulation line 30 is provided with a drive part such as a pump for circulating a chemical liquid, the space can be saved and costs can be decreased. Moreover, a lifetime of the apparatus can be elongated, resulting in improvement in reliability of the apparatus.

In addition, according to this embodiment, the inside of the chemical-liquid storing container 20 is pressurized by an inert gas supplied from the inert-gas supply source 40 so as to supply a chemical liquid into the cleaning tank 10. Thus, as compared with a case in which a drive part such as a pump is provided for supplying a chemical liquid, the space can be saved and costs can be decreased. Moreover, a lifetime of the apparatus can be elongated, resulting in improvement in reliability of the apparatus.

Further, according to this embodiment, a chemical liquid stored in the chemical-liquid storing container 20 is circulated through the first circulation line 32, the ejector 31, the second circulation line 33 and the inlet pipe 36, so as to reduce oxygen dissolved in the chemical liquid. After that, the respective opening and closing valve 22, 34, 35, 43, 44 and 51 are switched, and the chemical liquid is supplied into the cleaning tank 10. Thus, the oxygen dissolved in the chemical liquid to be used in the cleaning process of wafers W can be reliably reduced. In addition, while the chemical liquid is being supplied into the cleaning tank 10, the chemical liquid stored in the chemical-liquid storing container 20 is not circulated by the ejector 31 or the like. Thus, the amount of the chemical liquid to be supplied into the cleaning tank 10 can be stabilized. As a result, a cleaning efficiency of the wafer W can be improved.

Second Embodiment

Figure 3:
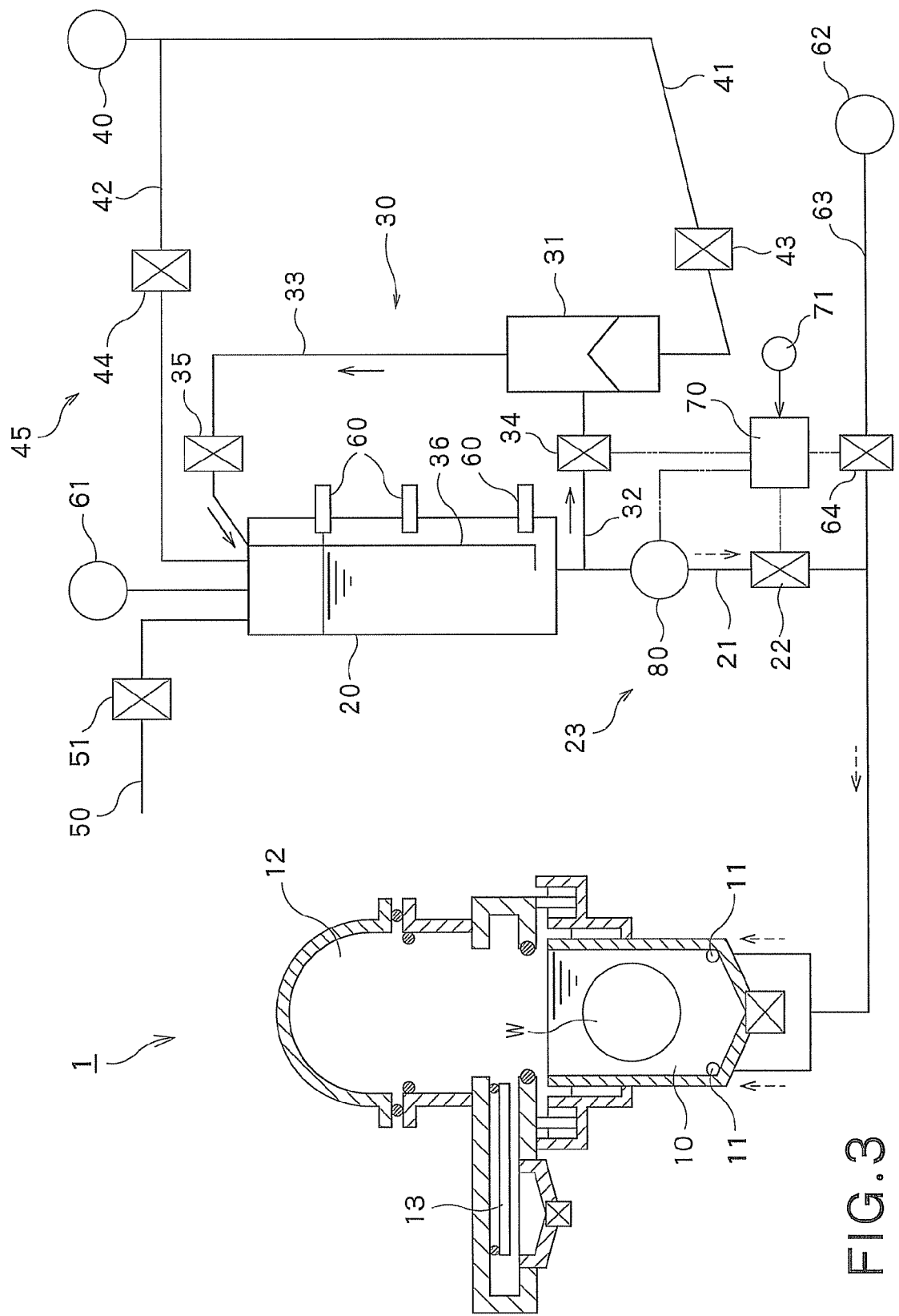
FIG. 3 is a substrate processing apparatus in a second embodiment of the present invention.

Next, a second embodiment of the present invention will be described with reference to FIG. 3. FIG. 3 is a view for explaining the second embodiment of a substrate processing apparatus, a substrate processing method, and a storage medium storing a computer program for performing the substrate processing method.

The second embodiment shown in FIG. 3 differs mainly from the first embodiment shown in FIGS. 1 and 2, in that the chemical-liquid supply driving part is formed of a pump. Other structure of the second embodiment is substantially the same with that of the first embodiment. In FIG. 3, the same parts as those of the first embodiment shown in FIGS. 1 and 2 are shown by the same reference numbers, and detailed description thereof is omitted.

As shown in FIG. 3, a chemical-liquid supply line 21 is provided, between a chemical-liquid supply opening and closing valve 22 and a chemical-liquid storing container 20, with a chemical-liquid supply pump 80 for feeding a chemical liquid into a cleaning tank 10. The chemical-liquid supply pump 80 constitutes a chemical-liquid supply driving part 23. The chemical-liquid supply pump 80 is connected to a control unit 70, and is configured to be driven based on a control signal from the control unit 70.

When wafers W are cleaned with the use of a chemical liquid, the control unit 70 opens the chemical-liquid supply opening and closing valve 22 and a second gas supply opening and closing valve 44, and closes a first circulation opening and closing valve 34, a second circulation opening and closing valve 35, a first gas supply opening and closing valve 43, and a gas discharge opening and closing valve 51. In addition, the chemical-liquid supply pump 80 is driven. Thus, a chemical liquid is supplied from the chemical-liquid storing container 20 into the cleaning tank 10. In addition, at this time, a deionized-water supply opening and closing valve 64 is opened by the control unit 70. Thus, a pressurized deionized water is supplied from a deionized-water supply source 62, and the pressurized deionized water is merged and mixed with the chemical liquid in the course of a deionized supply line 63 so as to be supplied into the cleaning tank 10. For this while, an inert gas is supplied to a gaseous phase space of the chemical-liquid storing container 20 from an inert-gas supply source 40 through a second gas supply line 42, to thereby prevent oxygen from being dissolved into the stored chemical liquid.

According to this embodiment, it goes without saying that the same effects as those of the first embodiment shown in FIGS. 1 and 2 can be obtained. In particular, in this embodiment, since the chemical-liquid supply pump 80 is used for supplying a chemical liquid from the chemical-liquid storing container 20 into the cleaning tank 10, the chemical liquid can be more smoothly supplied into the cleaning tank 10. This is advantageous when a chemical liquid having a high viscosity, which is used in a coating apparatus and a developing apparatus, for example, is supplied into the cleaning tank 10.

In this embodiment, even while a chemical liquid is being supplied into the cleaning tank 10, it is possible to bubble the chemical liquid stored in the chemical-liquid storing container 20 by operating the respective opening and closing valves 34, 35, 43 and 51. Owing to this operation, a concentration of oxygen dissolved in the chemical liquid can be further reduced. In this case, in order to improve precision of a flow rate of the chemical liquid to be supplied into the cleaning tank 10, a sensor such as a massflow controller may be provided on the chemical-liquid supply line 21 so as to control a flow rate of the chemical liquid.

In addition, in this embodiment, the supply of an inert gas from the inert-gas supply source 40 to the chemical-liquid storing container 20 through the second gas supply line 42 is not limited to the time period while a chemical liquid is being supplied into the cleaning tank 10. For example, during a circulation of the chemical liquid, an inert gas may be supplied at a predetermined timing into the chemical-liquid storing container 20 through the second gas supply line 42, so as to discharge oxygen present in the gaseous phase space in the upper part of the chemical-liquid storing container 20 by a gas discharge line 50. In this case, a concentration of oxygen dissolved in the chemical liquid can be further reduced.

Although the embodiments of the present invention have been described as above, the present invention can be naturally modified in various ways without the scope of the present invention. Typical modification examples will be described below.

In the above embodiments, the end of the first circulation line 32 on the side of the chemical-liquid storing container 20 is connected to the chemical-liquid supply line 21. However, not limited thereto, the first circulation line 32 may be directly connected to the chemical-liquid storing container 20.

In addition, in the above embodiments, hydrogen fluoride (HF) is used as a chemical liquid for etching an oxide film on the surface of a wafer W. However, not limited thereto, the present invention can be applied when a chemical liquid is a resist liquid for forming a photoresist film on a wafer W, or a polymer removal liquid for removing polymer (resist residue) formed on a wafer W. Also in this case, oxygen dissolved in the resist liquid or the polymer liquid can be efficiently reduced. Simultaneously, as compared with a case in which the circulation line 30 is provided with a drive part such as a pump for circulating a chemical liquid, the space can be saved and costs can be decreased. Moreover, a lifetime of the apparatus can be elongated, resulting in improvement in reliability of the apparatus. Further, the present invention can be applied when a chemical liquid is a plating liquid for plating a wafer W. Also in this case, the same effects as described above can be obtained In addition, in the above embodiments, the gas supply destination switching part 45 is formed of the first gas supply opening and closing valve 43 and the second gas supply opening and closing valve 44. However, not limited thereto, the gas supply destination switching part 45 may be constituted by a three-way valve.

Further, in the above embodiments, there is described the cleaning apparatus that cleans a plurality of wafers W by immersing the same in a chemical liquid or a deionized water. However, not limited thereto, the present invention can be applied to a cleaning apparatus of a sheet-fed type (not shown), which cleans wafers one by one.

As described above, the substrate processing apparatus 1 includes the control unit 70 having a computer. The respective constituent elements of the substrate processing apparatus 1 are operated by the control unit 70, such that the cleaning process of wafers W can be performed. The present invention claims a storage medium 71 storing a program executed by the computer of the control unit 70, in order to perform the cleaning process of wafers W with the use of the substrate processing apparatus 1. The storage medium 71 may be a memory such as a ROM or a RAM, or may be a disc-shaped storage medium such as a hard disc or a CD-ROM.

The invention claimed is:
1. A substrate processing apparatus comprising:
a processing part configured to process a substrate with the use of a chemical liquid;
a chemical-liquid supply line disposed between the processing part and a chemical-liquid storing container and configured to supply the chemical liquid from the chemical-liquid storing container into the processing part;
the chemical-liquid storing container configured to store the chemical liquid;
a chemical-liquid supply driving part configured to supply the chemical liquid from the chemical-liquid storing container into the processing part;
a circulation line configured to circulate the chemical liquid stored in the chemical-liquid storing container;
a mixture generating part provided on the circulation line; and
an inert-gas supply source configured to supply an inert gas into the mixture generating part;
wherein the mixture generating part is configured to mix the chemical liquid supplied from the chemical-liquid storing container and the inert gas supplied from the inert-gas supply source with each other so as to generate a gas-liquid mixture, and to supply the gas-liquid mixture into the chemical-liquid storing container.

2. The substrate processing apparatus according to claim 1, wherein
the mixture generating part is formed of an ejector configured to suck the chemical liquid from the chemical-liquid storing container, due to a flow of the supplied inert gas, and to mix the chemical liquid and the inert gas with each other so as to generate the gas-liquid mixture.

3. The substrate processing apparatus according to claim 1, wherein:
the inert-gas supply source is configured to supply an inert gas into the chemical-liquid storing container;
a gas supply destination switching part configured to switch a destination of the inert gas supplied from the inert-gas supply source, between the mixture generating part and the chemical-liquid storing container, is disposed between the inert-gas supply source and the mixture generating part;
when the chemical liquid is circulated in the circulation line, the inert gas is supplied into the mixture generating part; and
when the chemical liquid is supplied into the processing part, the inert gas is supplied into the chemical-liquid storing container.

4. The substrate processing apparatus according to claim 3, wherein:
a first gas supply line configured to supply the inert gas into the mixture generating part is disposed between the inert-gas supply source and the mixture generating part;
the first gas supply line is provided with a first gas supply opening and closing valve;
a second gas supply line configured to supply the inert gas into the chemical-liquid storing container is disposed between the inert-gas supply source and the chemical-liquid storing container;
the second gas supply line is provided with a second gas supply opening and closing valve; and
the gas supply destination switching part is formed of the first gas supply opening and closing valve and the second gas supply opening and closing valve.

5. The substrate processing apparatus according to claim 1, wherein
the chemical-liquid storing container is provided with an inlet part configured to introduce the gas-liquid mixture supplied from the mixture generating part into the stored chemical liquid.

6. The substrate processing apparatus according to claim 1, wherein:
the chemical-liquid supply line is provided with a chemical-liquid supply opening and closing valve;
the circulation line is provided with a first circulation opening and closing valve on a part where the chemical liquid is supplied from the chemical-liquid storing container into the mixture generating part;
when the chemical-liquid supply opening and closing valve is closed, the first circulation opening and closing valve is opened to supply the chemical liquid into the mixture generating part; and
when the chemical-liquid supply opening and closing valve is opened, the first circulation opening and closing valve is closed to supply the chemical liquid into the processing part.

7. The substrate processing apparatus according to claim 6, wherein
a gas discharge line configured to discharge a gas from an inside of the chemical-liquid storing container is connected to an upper part of the chemical-liquid storing container.

8. The substrate processing apparatus according to claim 7, wherein
the gas discharge line is provided with a gas discharge opening and closing valve, and
the gas discharge opening and closing valve is opened when the chemical-liquid supply opening and closing valve is closed.

9. The substrate processing apparatus according to claim 6, wherein
the circulation line is provided with a second circulation opening and closing valve on a part where the gas-liquid mixture is supplied from the mixture generating part into the chemical-liquid storing container, and
the second circulation opening and closing valve is opened when the chemical-liquid supply opening and closing valve is closed, while the second circulation opening and closing valve is closed when the chemical-liquid supply opening and closing valve is opened.

* * * * *